US012696629B2

(12) United States Patent
Qin et al.

(10) Patent No.: US 12,696,629 B2
(45) Date of Patent: Jul. 28, 2026

(54) DISPLAY PANEL HAVING LIGHT-TRANSMITTING HOLE AND UNDER-SCREEN CAMERA DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Shijian Qin, Shenzhen (CN); Libin Zhou, Shenzhen (CN)

( * ) Notice: Subject to any disclaimer, the term of this patent is extended or adjusted under 35 U.S.C. 154(b) by 1077 days.

(21) Appl. No.: 17/762,098

(22) PCT Filed: Mar. 2, 2022

(86) PCT No.: PCT/CN2022/078783
§ 371 (c)(1),
(2) Date: Aug. 31, 2023

(87) PCT Pub. No.: WO2023/159663
PCT Pub. Date: Aug. 31, 2023

(65) Prior Publication Data
US 2024/0114729 A1     Apr. 4, 2024

(30) Foreign Application Priority Data

Feb. 23, 2022    (CN) .......................... 202210168481.1

(51) Int. Cl.
*H10K 59/124*     (2023.01)
*H10K 59/122*     (2023.01)
*H10K 59/126*     (2023.01)
(52) U.S. Cl.
CPC ......... *H10K 59/124* (2023.02); *H10K 59/122* (2023.02); *H10K 59/126* (2023.02)

(58) Field of Classification Search
CPC .. H10K 59/124; H10K 59/122; H10K 59/126; H10K 59/121; H10K 59/65;
(Continued)

(56) References Cited

U.S. PATENT DOCUMENTS 10,879,491 B1 * 12/2020 Yoo ..................... H04M 1/0266
2021/0111374 A1 * 4/2021 Sung ..................... G06F 3/0412
2021/0376292 A1 * 12/2021 Choi ..................... H10K 59/353

FOREIGN PATENT DOCUMENTS

CN     110491910 A  * 11/2019
CN     111029381 A     4/2020
(Continued)

OTHER PUBLICATIONS

Chinese Office Action issued in corresponding Chinese Patent Application No. 202210168481.1 dated Nov. 9, 2024, pp. 1-7.
(Continued)

*Primary Examiner* — Duy T Nguyen

(57)     ABSTRACT

The present invention provides a display panel and an under-screen camera display device. The display panel includes a first display area and a light sensing area, and the light sensing area includes the first display area and a light-transmitting hole area. The display panel further includes: a base; a TFT layer, wherein the TFT layer includes a composite insulating layer; a planarization layer formed on the TFT layer; a light-emitting sub-pixel unit including a pixel definition layer formed on the planarization layer. The composite insulating layer located in the light-transmitting hole area is provided with a light-transmitting hole, and a portion of the base is exposed from the light-transmitting hole.

16 Claims, 1 Drawing Sheet

1000

(58) Field of Classification Search
CPC ......... Y02E 10/549; G09F 9/301; G09F 9/33;
H10D 86/40; H10D 86/60
USPC ......................................................... 257/72
See application file for complete search history.

(56) References Cited

FOREIGN PATENT DOCUMENTS

| | | | |
|---|---|---|---|
| CN | 111755460 | A | 10/2020 |
| CN | 112258987 | A | 1/2021 |
| CN | 113363305 | A | 9/2021 |
| CN | 113629208 | A | 11/2021 |
| CN | 113764471 | A | 12/2021 |
| WO | 2018212089 | A1 | 11/2018 |

OTHER PUBLICATIONS

International Search Report in International application No. PCT/CN2022/078783,mailed on May 26, 2022.
Written Opinion of the International Search Authority in International application No. PCT/CN2022/078783,mailed on May 26, 2022.
Chinese Office Action issued in corresponding Chinese Patent Application No. 202210168481.1 dated Apr. 18, 2026, pp. 1-8.

* cited by examiner

1000

1000

DISPLAY PANEL HAVING LIGHT-TRANSMITTING HOLE AND UNDER-SCREEN CAMERA DISPLAY DEVICE

FIELD

The present disclosure relates to the field of under-screen camera display technologies, and more particularly, to a display panel and an under-screen camera display device.

BACKGROUND

With continuous development of technology, mobile phones are continuously upgrading and people's require-ments for mobile phone screens are also getting higher. Currently, most mobile phones on the market are punch-hole screens. However, punch-hole screens have many technical difficulties, such as difficult packaging and complicated processes. Mobile phone screen manufacturers around the world are making every effort to develop full-screen screens. It is because full-screen mobile phones can not only improve appearance of mobile phones and make the mobile phones have more sense of high-tech, but also accommodate larger screens and enhance visual experience. However, full-screen screen technology still faces difficulties in design and manu-facture processes, such as problems of how microphones and front cameras are positioned.

As a key technology, under-screen cameras solve a prob-lem of positioning the front cameras, which are favored by people and widely used in manufacturing flexible organic light-emitting diodes (OLEDs). However, the under-screen cameras have high requirements on OLED technology, and the OLEDs need to have high light transmittance in camera areas, so as not to affect capturing of external light of the cameras. In the prior art, downsizing pixels in a display area and reducing an area of display pixels are methods often adopted to increase light transmittance of a display panel. However, both of the methods are difficult to reduce an area of a light shielding layer in a bottom portion, which easily cause the light transmittance of the display panel to be insufficient, thus affecting quality of light received by a camera light sensor element of a camera.

Therefore, it is necessary to develop a new type of display panel and an under-screen camera display device to over-come defects of the prior art.

A conventional display panel does not have sufficient light transmittance.

SUMMARY

Therefore, the present invention provides a display panel and an under-screen camera display device that can reduce an area of a light shielding layer and have high light transmittance.

The present invention provides a display panel, including a first display area and a light sensing area. The light sensing area includes a second display area and a light-transmitting hole area. The first display area surrounds the second display area, and the second display area surrounds the light-transmitting hole area. The display panel located in the light sensing area further includes:

a base;

a drive transistor layer formed on the base, wherein the drive transistor layer includes a composite insulating layer;

a planarization layer formed on the drive transistor layer; and a light-emitting sub-pixel unit including a pixel definition layer, wherein the pixel definition layer is formed on the planarization layer.

A light-transmitting hole is formed on the composite insulating layer in the light-transmitting hole area, a portion of the base is exposed from the light-transmitting hole, and a portion of the planarization layer and a portion of the pixel definition layer are filled in the light-transmitting hole.

In an optional embodiment of the present invention, the drive transistor layer includes at least one drive transistor, the drive transistor is located in the second display area, the light-emitting sub-pixel unit further includes at least one anode formed on the planarization layer and at least two light-emitting sub-pixels formed in the pixel definition layer, and the anode and the drive transistor are electrically con-nected and correspond to the at least two light-emitting sub-pixels.

In an optional embodiment of the present invention, the display panel further includes a light shielding layer, the light shielding layer is formed on the base, the drive tran-sistor layer covers the light shielding layer, and a position of the light shielding layer corresponds to a position of the drive transistor.

In an optional embodiment of the present invention, a projection of the drive transistor is at least partially over-lapped with a projection of the light shielding layer corre-sponding to the drive transistor on the base.

In an optional embodiment of the present invention, the composite insulating layer includes a buffer layer, a gate insulating layer, an interlayer insulating layer, and a passi-vation layer. The drive transistor layer further includes an active layer, a gate, and a source and drain layer. The buffer layer is formed on the base and covers the light shielding layer. The active layer is formed on the buffer layer. The gate insulating layer is formed between the active layer and the gate. The interlayer insulating layer is formed on the buffer layer and covers the active layer and the gate. The source and drain layer is formed on the interlayer insulating layer and electrically connected to the active layer and the light shielding layer. The passivation layer is formed on the interlayer insulating layer and covers the source and drain layers. The planarization layer is formed on the passivation layer. The light-transmitting hole penetrates through the buffer layer, the interlayer insulating layer, and the passiva-tion layer. The active layer, the gate, the source and drain layer, and the gate insulating layer, the interlayer insulating layer, and the passivation layer corresponding to the active layer, the gate, and the source and drain layer form the drive transistor.

In an optional embodiment of the present invention, the light-transmitting hole is located between two adjacent ones of the anodes.

In an optional embodiment of the present invention, the base includes a first flexible base layer, a water and oxygen blocking layer, and a second flexible base layer that are stacked together, and the light shielding layer is formed on the second flexible base layer.

In an optional embodiment of the present invention, a distance between an end of the anode adjacent to the light-transmitting hole and the light-transmitting hole ranges from 5 μm to 20 μm.

In an optional embodiment of the present invention, the water and oxygen blocking layer of the base is located in the second display area.

In an optional embodiment of the present invention, the base includes a first flexible base layer and a second flexible base layer that are stacked together, and the light shielding layer is formed on the second flexible base layer.

The present invention further provides an under-screen camera display device including a camera light sensing element. The under-screen camera display device further includes the above-mentioned display panel. The camera light sensing element is located on a side of the base away from the drive transistor layer and located in the second display area and the light-transmitting hole area.

In the display panel and the under-screen camera display device of the present invention, the light-transmitting hole on the insulating layer of the drive transistor layer is formed between the two adjacent anodes to the base which is exposed from the light-transmitting hole, and the planarization layer and the pixel definition layer are filled in the light-transmitting hole, which can reduce the light reflection between the adjacent film layers in the insulating layer, between the insulating layer and the planarization layer, and between the insulating layer and the base, thereby increasing the light transmittance of the display panel. In addition, adopting the drive transistor to drive two or more light-emitting sub-pixels at the same time can reduce the number of the drive transistors. Since the light shielding layers correspond to the drive transistors in a one-to-one correspondence, the present invention further reduces the number of the light shielding layers, thereby reducing the area of the light shielding layers, which increases the light transmittance of the display panel of the under-screen camera display device.

DESCRIPTION OF DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

DETAILED DESCRIPTION

The technical solution of the present invention embodiment will be clarified and completely described with reference accompanying drawings in embodiments of the present invention embodiment. Obviously, the present invention described parts of embodiments instead of all of the embodiments. Based on the embodiments of the present invention, other embodiments which can be obtained by a skilled in the art without creative efforts fall into the protected scope of the present invention.

In the description of the present invention, it should be explained that directional or positional relationships indicated by terms "upper", "lower", etc. are based on the drawings. The directional or positional relationships are only for the convenience of describing the present invention and simplifying the description, and does not indicate or imply that the device or element referred to must have a specific orientation, structure and operation in a specific orientation, and should not be viewed as limitations of the present invention. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present invention, the meaning of "multiple" is two or more, unless specifically defined otherwise.

The present invention may repeat reference numbers and/or reference letters in different examples, and such repetition is for the purpose of simplicity and clarity, and does not indicate the relationship between the various embodiments and/or settings.

Aiming at a technical problem of low light transmittance of a conventional under-screen camera display device, the present invention forms a light-transmitting hole on an insulating layer of a drive transistor layer between two adjacent anodes to a base which is exposed from the light-transmitting hole, and a planarization layer and a pixel definition layer are filled in the light-transmitting hole, which can reduce light reflection between adjacent film layers in the insulating layer, between the insulating layer and the planarization layer, and between the insulating layer and the base, thereby increasing light transmittance of the display panel. In addition, adopting a drive transistor to drive two or more light-emitting sub-pixels at a same time can reduce a number of drive transistors. Since light shielding layers correspond to the drive transistors in a one-to-one correspondence, the present invention further reduces a number of the light shielding layers, thereby reducing an area of the light shielding layers, which increases the light transmittance of the display panel of the under-screen camera display device.

Figure 1:
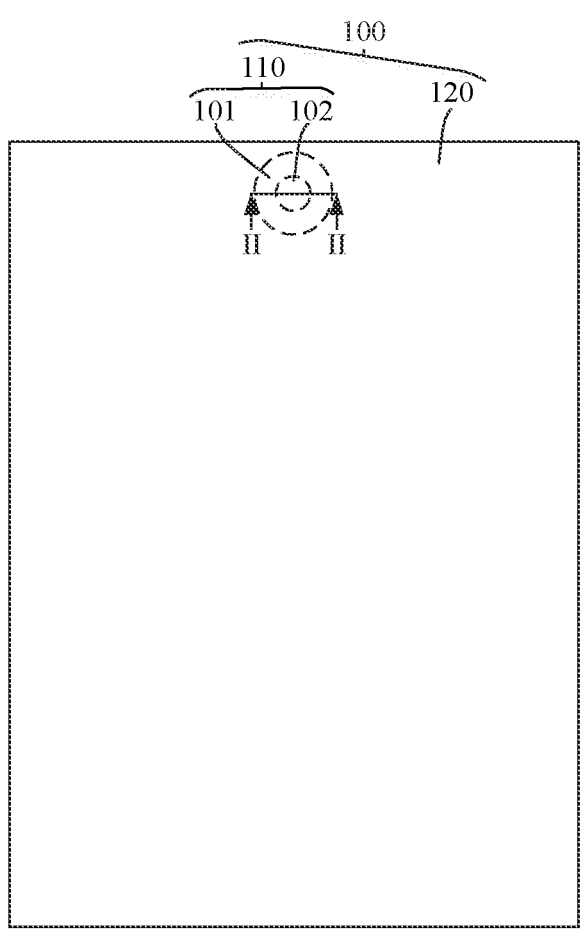
FIG. 1 is a top view of an under-screen camera display device provided by a preferred embodiment of the present invention.
Figure 2:
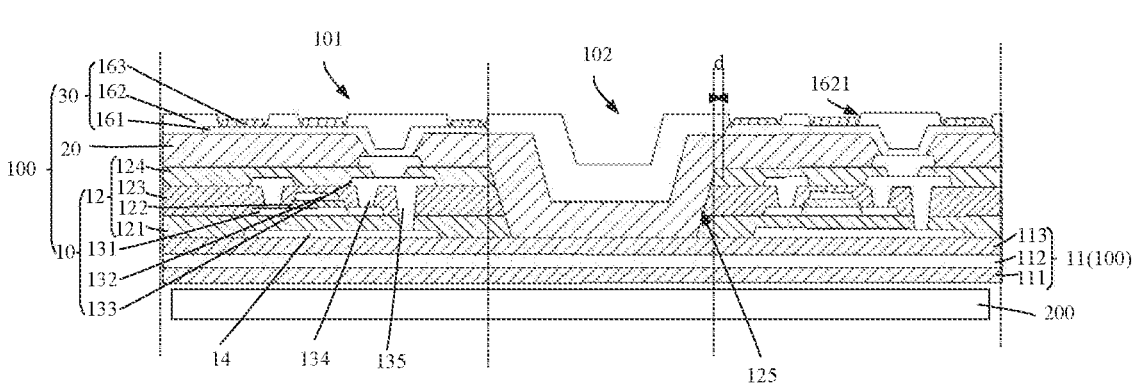
FIG. 2 is a cross-sectional view taken along a line II-II in FIG. 1.

Referring to FIG. 1 to FIG. 2, a preferred embodiment of the present invention provides an under-screen camera display device 1000. The under-screen camera display device 1000 can be a display device with a camera light sensor element such as a mobile phone, a tablet computer, or a computer. In this embodiment, the under-screen camera display device 1000 is a mobile phone. Specifically, the under-screen camera display device 1000 includes a display panel 100 and a camera light sensor element 200 located on a side of the display panel 100. Light incidents into the display panel 100 from a side of the display panel 100 away from the camera light sensor element 200, and the camera light sensor element 200 receives external light through the display panel 100.

Reference is further made to FIG. 1, the display panel 100 includes a light sensing area 110 and a first display area 120 disposed around the light sensing area 110. An area of the light sensing area 110 is much smaller than an area of the first display area 120. The camera light sensing element 200 corresponds to the light sensing area 110 of the display panel 100. The light sensing area 110 includes a second display area 101 and a light-transmitting hole area 102; the first display area 120 surrounds the second display area 101, and the second display area 101 surrounds the light-transmitting hole area 102.

Reference is further made to FIG. 2, the display panel 100 located in the light sensing area 110 includes an array layer 10, a planarization layer 20 formed on the array layer 10, and a light-emitting sub-pixel unit 30 formed on the planarization layer 20. The array layer 10 drives the light-emitting sub-pixel unit 30 to emit light.

The array layer 10 includes a base 11, a drive transistor layer formed on the base 11, and a light shielding layer 14 formed on the base 11. The drive transistor layer covers the light shielding layer 14. The planarization layer 20 is formed on the drive transistor layer.

In an optional embodiment of the present invention, the base 11 includes a first flexible base layer 111, a water and oxygen blocking layer 112, and a second flexible base layer 113 stacked together. The light shielding layer 14 is formed on the second flexible base layer 113. The water and oxygen blocking layer 112 can prevent external water vapor and oxygen from entering the display panel 100, thereby reducing damage caused by the external water vapor and oxygen to wires of the drive transistor layer and increasing a service life of the display panel 100.

Materials of the first flexible base layer 111 and the second flexible base layer 113 can be polyimide or other flexible materials. A material of the water and oxygen blocking layer 112 can be inorganic oxide or organic-inorganic laminate. In an organic-inorganic laminate structure, an inorganic layer has high water resistance and oxygen resistance, and an organic layer can serve a purpose of smoothing and filling defects, and said structure can prevent defects of an oxide layer in a multi-layer structure from expanding. Inorganic materials mainly include oxides and nitrides, such as $SiO_x$, $SiN_x$, $Al_2O_3$, etc.

In another optional embodiment of the present invention, the water and oxygen blocking layer 112 of the base 11 is located in the second display area 101. That is, the water and oxygen blocking layer 112 of the base 11 is not located in the light-transmitting hole area 102.

In other embodiments, the base 11 may not include the water and oxygen blocking layer 112.

Reference is further made to FIG. 2, the drive transistor layer includes a composite insulating layer 12, and the planarization layer 20 is formed on the composite insulating layer 12. A light-transmitting hole 125 is formed on the composite insulating layer 12 in the light-transmitting hole area 102, the light-transmitting hole 125 penetrates through the composite insulating layer 12, a portion of the base 11 is exposed from the light-transmitting hole 125, and a portion of the planarization layer 20 is filled in the light-transmitting hole 125.

The light-transmitting holes 125 can be formed through an etching process, mechanical cutting, etc.

In an optional embodiment of the present invention, the composite insulating layer 12 includes a buffer layer 121, a gate insulating layer 122, an interlayer insulating layer 123, and a passivation layer 124 that are stacked, and the buffer layer 121 is formed on the base 11 and covers the light shielding layer 14.

In an optional embodiment of the present invention, the composite insulating layer 12 may also not include the buffer layer 121.

In an optional embodiment of the present invention, the light-transmitting hole 125 penetrates through the buffer layer 121, the interlayer insulating layer 123, and the passivation layer 124.

In other embodiments, the light-transmitting hole 125 may also penetrate through the buffer layer 121, the gate insulating layer 122, the interlayer insulating layer 123, and the passivation layer 124. At this time, the gate insulating layer 122 can be formed on the buffer layer 121 and cover the active layer 131.

Certainly, when the composite insulating layer 12 does not include the buffer layer 121, the light-transmitting hole 125 does not penetrate through the buffer layer 121.

The drive transistor layer further includes an active layer 131, a gate 132, and a source and drain layer 133. The active layer 131 is formed on the buffer layer 121, and the gate insulating layer 122 is formed between the active layer 131 and the gate 132. The interlayer insulating layer 123 is formed on the buffer layer 121 and covers the active layer 131 and the gate 132. The source and drain layer 133 is formed on the interlayer insulating layer 123 and is electrically connected to the active layer 131 and the light shielding layer 14, respectively. The passivation layer 124 is formed on the interlayer insulating layer 123 and covers the source and drain layer 133. The planarization layer 20 is formed on the passivation layer 124. The active layer 131, the gate 132, the source and drain layer 133, and the gate insulating layer 122, the interlayer insulating layer 123, and the passivation layer 124 corresponding to the active layer 131, the gate 132, and the source and drain layer 133 form a drive transistor. The drive transistor is located in the second display area 101. A position of one of the drive transistors corresponds to a position of one of the light shielding layers 14.

In an optional embodiment of the present invention, a projection of one of the drive transistors is at least partially overlapped with a projection of one of the light shielding layers 14 corresponding to the one of the drive transistors on the base 11.

Specifically, the active layer 131 includes a channel area (not shown) and a source area (not shown) and a drain area (not shown) located on two sides of the channel area. A position of the gate 132 corresponds to a position of the channel area, and the source and drain layer includes a source (not labeled) and a drain (not labeled). The source and the source area, and the drain and the drain area are respectively electrically connected to each other through a first blind hole 134, and the drain is electrically connected to the light shielding layer 14 through a second blind hole 135.

The drive transistor layer can be formed by a film forming process, a yellow light process, and an etching process.

Certainly, in other embodiments, a structure of the drive transistor layer is not limited to above-mentioned structures, and can be designed according to actual requirements.

Reference is further made to FIG. 2, the light-emitting sub-pixel unit 30 includes at least one anode 161, a pixel definition layer 162, and at least two light-emitting sub-pixels 163. The anode 161 is formed on the planarization layer 20 and electrically connected to one of the drive transistors corresponding to the anode 161. The pixel definition layer 162 is formed on the planarization layer 20 and covers the anode 161. At least two pixel openings 1621 are formed on the pixel definition layer 162, and the pixel openings 1621 accommodates the light-emitting sub-pixels 163. One of the pixel openings 1621 accommodates one of the light-emitting sub-pixels 163. In the present invention, the light-transmitting holes 125 are located between two adjacent anodes 161, the anodes 161 and the light-emitting sub-pixels 163 are both located in the second display area 101, and a portion of the pixel definition layer 162 is filled in the light-transmitting hole 125.

The planarization layer 20 and the pixel definition layer 162 are both filled in the light-transmitting hole 125, which can reduce the light reflection between adjacent film layers in the composite insulating layer 12 (e.g., between the buffer layer 121 and the gate insulating layer 122, between the gate insulating layer 122 and the interlayer insulating layer 123, and between the interlayer insulating layer 123 and the passivation layer 124), between the composite insulating layer 12 and the planarization layer 20, and between the composite insulating layer 12 and the base 11, thereby increasing the light transmittance of the display panel 100.

The anode 161 is electrically connected to one of the drive transistors and corresponds to the at least two light-emitting sub-pixels 163. That is to say, one of the drive transistors simultaneously drives the at least two light-emitting sub-pixels 163 to emit light.

A material of the anode 161 can be a transparent material, such as an ITO material, or a common anode material.

In an optional embodiment of the present invention, a distance d from an end of the anode 161 adjacent to the light-transmitting hole 125 to the light-transmitting hole 125 ranges from 5 μm to 20 μm, so as to prevent the anode 161 from collapsing due to insufficient supporting force, thereby affecting performance of the display panel 100.

In the present invention, one of the drive transistors of the display panel 100 located in the light sensing area 110 drives the at least two light-emitting sub-pixels 163 simultaneously through the anode 161, and corresponds to only one of the light shielding layers 14, which reduces the number of the drive transistors and further reduces the number of the light shielding layers 14, thereby reducing the area of the light shielding layer 14 and increasing the light transmittance of the display panel 100 of the under-screen camera display device 1000. At a same time, the source and drain layer 133 is electrically connected to the light shielding layer 14, and the light shielding layer 14 can serve as a gate, thereby forming a double gate structure, which can increase electron mobility and on current in the drive transistor, which can reduce capacitance of a transistor and capacitance of a metal cross-line area.

Specifically, when the light shielding layer 14 completely covers a corresponding one of the drive transistors and a number of the light-emitting sub-pixels 163 driven by one of the drive transistors at a same time is N, the area of the light shielding layer 14 can be reduced by N–1/N, wherein N is greater than or equal to 2. For example, when N=2, the area of the light shielding layer 14 can be reduced by 50%, when N=3, the area of the light shielding layer 14 can be reduced by 67%, and so on.

Specifically, the area of the light shielding layer 14 in the light sensing area of the present invention is smaller than an area of a light shielding layer in a conventional display area. The light shielding layer 14 can also only serve a purpose of wire compensation. In an optional embodiment of the present invention, the area of the light shielding layer 14 can be reduced by only 90%.

The display panel 100 further includes a cathode, a package layer, a glass cover, etc. The cathode, the package layer, and the glass cover are conventional structures in the industry, and will not be described in details herein.

The camera light sensing element 200 can be a camera, an infrared sensor, etc. In this embodiment, the camera light sensing element 200 is a camera.

In the display panel and the under-screen camera display device of the present invention, the light-transmitting hole on the insulating layer of the drive transistor layer is formed between the two adjacent anodes to the base which is exposed from the light-transmitting hole, and the planarization layer and the pixel definition layer are filled in the light-transmitting hole, which can reduce the light reflection between the adjacent film layers in the insulating layer, between the insulating layer and the planarization layer, and between the insulating layer and the base, thereby increasing the light transmittance of the display panel. In addition, adopting the drive transistor to drive two or more light-emitting sub-pixels at a same time can reduce the number of the drive transistors. Since the light shielding layers correspond to the drive transistors in a one-to-one correspondence, the present invention further reduces the number of the light shielding layers, thereby reducing the area of the light shielding layers, which increases the light transmittance of the display panel of the under-screen camera display device.

The display panel and the under-screen camera display device provided by embodiments of the present invention are described in detail above, and the description of embodiments above is only for helping to understand technical solutions of the present invention and its core idea. It should be understood that for a person of ordinary skill in the art can make various modifications of the technical solutions of the embodiments of the present invention above. However, it does not depart from the scope of the technical solutions of the embodiments of the present invention.

What is claimed is:

1. A display panel, comprising a first display area and a light sensing area, the light sensing area comprising a second display area and a light-transmitting hole area, the first display area surrounding the second display area, and the second display area surrounding the light-transmitting hole area; wherein a portion of the display panel located in the light sensing area further comprises:

a base;

a drive transistor layer formed on the base, wherein the drive transistor layer comprises a composite insulating layer;

a planarization layer formed on the drive transistor layer; and a light-emitting sub-pixel unit comprising a pixel definition layer, wherein the pixel definition layer is formed on the planarization layer;

wherein a light-transmitting hole is formed on the composite insulating layer in the light-transmitting hole area, a portion of the base is exposed from the light-transmitting hole, and a portion of the planarization layer and a portion of the pixel definition layer are filled in the light-transmitting hole;

wherein the drive transistor layer comprises at least one drive transistor, the drive transistor is located in the second display area, and the light-emitting sub-pixel unit further comprises at least one anode formed on the planarization layer and at least two light-emitting sub-pixels formed in the pixel definition layer, wherein the at least one drive transistor is electrically connected to the at least one anode, and each drive transistor is electrically connected to and corresponds to two of the light-emitting sub-pixels;

wherein the display panel further comprises at least one light shielding layer formed on the base, and the drive transistor layer covers the light shielding layer and is disposed in a one-to-one correspondence with the at least one drive transistor;

wherein the composite insulating layer comprises a buffer layer, a gate insulating layer, an interlayer insulating layer, and a passivation layer; the buffer layer is formed on the base; the light-transmitting hole penetrates through the buffer layer, the interlayer insulating layer, and the passivation layer.

2. The display panel according to claim 1, wherein a projection of the drive transistor is at least partially overlapped with a projection of the light shielding layer corresponding to the drive transistor on the base.

3. The display panel according to claim 1, wherein the drive transistor layer further comprises an active layer, a gate, and a source and drain layer; wherein the buffer layer covers the light shielding layer, and the active layer is formed on the buffer layer; the gate insulating layer is formed between the active layer and the gate, and the interlayer insulating layer is formed on the buffer layer and covers the active layer and the gate; the source and drain layer is formed on the interlayer insulating layer and electrically connected to the active layer and the light shielding layer, respectively, the passivation layer is formed on the interlayer insulating layer and covers the source and drain layers, and the planarization layer is formed on the passivation layer; wherein the active layer, the gate, the source and drain layer, and the gate insulating layer, the interlayer insulating layer, and the passivation layer corresponding to the active layer, the gate, and the source and drain layer form the drive transistor.

4. The display panel according to claim 1, wherein the light-transmitting hole is located between two adjacent ones of the anodes.

5. The display panel according to claim 1, wherein the base comprises a first flexible base layer, a water and oxygen blocking layer, and a second flexible base layer that are stacked together, and a light shielding layer is formed on the second flexible base layer.

6. The display panel according to claim 5, wherein a distance between an end of the anode adjacent to the light-transmitting hole and the light-transmitting hole ranges from 5 μm to 20 um.

7. The display panel according to claim 5, wherein the water and oxygen blocking layer of the base is located in the second display area.

8. The display panel according to claim 1, wherein the base comprises a first flexible base layer and a second flexible base layer that are stacked together, and a light shielding layer is formed on the second flexible base layer.

9. An under-screen camera display device comprising a camera light sensing element, wherein the under-screen camera display device further comprises a display panel, the camera light sensing element is located on a side of a base away from a drive transistor layer and located in a second display area and a light-transmitting hole area, the display panel comprises a first display area and a light sensing area, and the light sensing area comprises the second display area and the light-transmitting hole area; the first display area surrounds the second display area, and the second display area surrounds the light-transmitting hole area; wherein a portion of the display panel located in the light sensing area further comprises:

the base;
the drive transistor layer formed on the base, wherein the drive transistor layer comprises a composite insulating layer;
a planarization layer formed on the drive transistor layer; and
a light-emitting sub-pixel unit comprising a pixel definition layer, wherein the pixel definition layer is formed on the planarization layer;
wherein a light-transmitting hole is formed on the composite insulating layer in the light-transmitting hole area, a portion of the base is exposed from the light-transmitting hole, and a portion of the planarization layer and a portion of the pixel definition layer are filled in the light-transmitting hole;
wherein the drive transistor layer comprises at least one drive transistor, the drive transistor is located in the second display area, and the light-emitting sub-pixel unit further comprises at least one anode formed on the planarization layer and at least two light-emitting sub-pixels formed in the pixel definition layer, wherein the at least one drive transistor is electrically connected to the at least one anode, and each drive transistor is electrically connected to and corresponds to two of the light-emitting sub-pixels;

wherein the display panel further comprises at least one light shielding layer formed on the base, and the drive transistor layer covers the light shielding layer and is disposed in a one-to-one correspondence with the at least one drive transistor;

wherein the composite insulating layer comprises a buffer layer, a gate insulating layer, an interlayer insulating layer, and a passivation layer; the buffer layer is formed on the base; the light-transmitting hole penetrates through the buffer layer, the interlayer insulating layer, and the passivation layer.

10. The under-screen camera display device according to claim 9, wherein a projection of the drive transistor is at least partially overlapped with a projection of the light shielding layer corresponding to the drive transistor on the base.

11. The under-screen camera display device according to claim 9, wherein the drive transistor layer further comprises an active layer, a gate, and a source and drain layer; wherein the buffer layer covers the light shielding layer, and the active layer is formed on the buffer layer;

the gate insulating layer is formed between the active layer and the gate, and the interlayer insulating layer is formed on the buffer layer and covers the active layer and the gate; the source and drain layer is formed on the interlayer insulating layer and electrically connected to the active layer and the light shielding layer, respectively, the passivation layer is formed on the interlayer insulating layer and covers the source and drain layers, and the planarization layer is formed on the passivation layer; wherein the active layer, the gate, the source and drain layer, and the gate insulating layer, the interlayer insulating layer, and the passivation layer corresponding to the active layer, the gate, and the source and drain layer form the drive transistor.

12. The under-screen camera display device according to claim 9, wherein the light-transmitting hole is located between two adjacent ones of the anodes.

13. The under-screen camera display device according to claim 9, wherein the base comprises a first flexible base layer, a water and oxygen blocking layer, and a second flexible base layer that are stacked together, and a light shielding layer is formed on the second flexible base layer.

14. The under-screen camera display device according to claim 13, wherein a distance between an end of the anode adjacent to the light-transmitting hole and the light-transmitting hole ranges from 5 μm to 20 μm.

15. The under-screen camera display device according to claim 13, wherein the water and oxygen blocking layer of the base is located in the second display area.

16. The under-screen camera display device according to claim 9, wherein the base comprises a first flexible base layer and a second flexible base layer that are stacked together, and a light shielding layer is formed on the second flexible base layer.

* * * * *